United States Patent
Lee et al.

(10) Patent No.: US 11,217,740 B2
(45) Date of Patent: Jan. 4, 2022

(54) THERMOELECTRIC MODULE

(71) Applicants: Hyundai Motor Company, Seoul (KR); Kia Motors Corporation, Seoul (KR)

(72) Inventors: Woo Ju Lee, Seoul (KR); Byung Wook Kim, Seongnam-si (KR); Hoo Dam Lee, Seongnam-si (KR); Jin Woo Kwak, Suwon-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 50 days.

(21) Appl. No.: 16/667,583

(22) Filed: Oct. 29, 2019

(65) Prior Publication Data
US 2020/0357974 A1 Nov. 12, 2020

(30) Foreign Application Priority Data
May 7, 2019 (KR) .................. 10-2019-0052920

(51) Int. Cl.
*H01L 35/32* (2006.01)
*H01L 35/06* (2006.01)
*H01L 35/14* (2006.01)

(52) U.S. Cl.
CPC .............. *H01L 35/32* (2013.01); *H01L 35/06* (2013.01); *H01L 35/14* (2013.01)

(58) Field of Classification Search
CPC ......... H01L 35/04; H01L 35/06; H01L 35/32; H01L 35/28
See application file for complete search history.

(56) References Cited

U.S. PATENT DOCUMENTS

| 3,377,206 | A  | * | 4/1968 | Hanlein et al. | ......... | H01L 35/06 136/212 |
| 6,347,521 | B1 | * | 2/2002 | Kadotani | ................ | F25B 21/02 136/204 |
| 6,410,971 | B1 | * | 6/2002 | Otey | ..................... | H01L 31/058 257/467 |

(Continued)

FOREIGN PATENT DOCUMENTS

KR    10-2020-0067647 A    6/2020

*Primary Examiner* — Christina Chern
(74) *Attorney, Agent, or Firm* — Morgan, Lewis & Bockius LLP

(57) ABSTRACT

A thermoelectric module includes: unit thermoelectric materials including N-type thermoelectric materials and P-type thermoelectric materials and arranged on one surface of a first substrate; first electrodes each electrically connected to one end of a respective one of the N-type thermoelectric materials or to one end of a respective one of the P-type thermoelectric materials; second electrodes each disposed to be spaced apart from the other end of the respective one of the N-type thermoelectric materials and the other end of the respective one of the P-type thermoelectric materials by a predetermined gap; and a second substrate supporting the second electrodes, in which each of the second electrodes is electrically connected to the second end of the respective one of the N-type thermoelectric materials and the second end of the respective one of the P-type thermoelectric materials when a pressing force is applied to the second substrate.

10 Claims, 9 Drawing Sheets

(56) References Cited

U.S. PATENT DOCUMENTS

| | | | | |
|---|---|---|---|---|
| 2003/0084935 A1* | 5/2003 | Bell | ........................ | H01L 35/32 |
| | | | | 136/200 |
| 2008/0264464 A1* | 10/2008 | Lee | ........................ | A61F 7/007 |
| | | | | 136/201 |
| 2017/0301850 A1* | 10/2017 | Himmer | .................. | H01L 35/32 |
| 2020/0176660 A1 | 6/2020 | Lee et al. | | |

* cited by examiner

THERMOELECTRIC MODULE

CROSS-REFERENCE TO RELATED APPLICATIONS

The present application claims the benefit of priority to Korean Patent Application No. 10-2019-0052920, filed on May 7, 2019 in the Korean Intellectual Property Office, the entire disclosure of which is incorporated herein by reference.

TECHNICAL FIELD

The present disclosure relates to a thermoelectric module, and more particularly, to a thermoelectric module capable of performing local temperature control in response to a pressure and improving energy efficiency.

BACKGROUND

Because a temperature control system using an air conditioning device controls a temperature based on a temperature of air the temperature control system requires a large amount of energy consumption, and it takes a lot of time for a user to sense a change in temperature. As a result, there is a limitation in that it is difficult to improve temperature control efficiency and energy efficiency to a certain level.

Recently, a temperature control system has been developed, in which a thermoelectric module capable of heating and cooling is brought into direct contact with a user.

In general, the thermoelectric module is manufactured by connecting electrodes to P-type and N-type thermoelectric materials on a substrate and has an advantage of having a low thermal loss and performing quick temperature control.

However, in the case of the thermoelectric module in the related art, an entire region of the thermoelectric module is controlled to have a uniform temperature regardless of whether the thermoelectric module is in contact with a user's body, so that the temperature control is performed even on a region where the temperature control is not actually required (e.g., a non-contact region where the thermoelectric module is not in contact with the body). As a result, there is a problem in that a thermal loss inevitably occurs and unnecessary power consumption increases.

Therefore, recently, various types of research are conducted to improve energy efficiency by performing local temperature control in accordance with a user's body type and posture, but the research result is still insufficient. Accordingly, there is a need for development of the thermoelectric module for improving energy efficiency.

SUMMARY

An object of the present disclosure is to provide a thermoelectric module capable of performing local temperature control in response to a pressure and improving temperature control efficiency and energy efficiency.

Another object of the present disclosure is to locally control a temperature only in a region where a thermoelectric module is actually in contact with a user's body in accordance with the user's body type and posture.

In order to achieve the above-mentioned objects, a thermoelectric module according to an exemplary embodiment of the present disclosure includes: a first substrate; multiple unit thermoelectric materials including N-type thermoelectric materials and P-type thermoelectric materials and arranged on one surface of the first substrate; multiple first electrodes each electrically connected to a first end of a respective one of the N-type thermoelectric materials or to a first end of a respective one of the P-type thermoelectric materials and configured to be supplied with electric power from a power supply unit; multiple second electrodes each disposed to be spaced apart from a second end of the respective one of the N-type thermoelectric materials and a second end of the respective one of the P-type thermoelectric materials by a predetermined gap; and a second substrate configured to support the second electrodes. Each of the second electrodes is electrically connected to the second end of the respective one of the N-type thermoelectric materials and the second end of the respective one of the P-type thermoelectric materials when a pressing force is applied to the second substrate from outside.

This configuration is intended to improve temperature control efficiency and energy efficiency of the thermoelectric module.

That is, in the related art, an entire region of the thermoelectric module is controlled to have a uniform temperature regardless of whether the thermoelectric module is in contact with a user's body, so that the temperature control is performed even on a region where the temperature control is not actually required (e.g., a non-contact region where the thermoelectric module is not in contact with the body). As a result, there is a problem in that a thermal loss inevitably occurs and unnecessary power consumption increases.

However, according to some aspects of the present disclosure, only in the region where the pressing force is applied (the user's body comes into contact with the thermoelectric module) the second electrode comes into contact with the unit thermoelectric material and the N-type thermoelectric material and the P-type thermoelectric material, which constitute the unit thermoelectric material, form a closed circuit (the cooling or heating is performed by the unit thermoelectric material), thereby obtaining an advantageous effect of minimizing a thermal loss and significantly reducing electric power consumption.

Therefore, the temperature control is not performed on the entire region of the thermoelectric module in a lump, but the temperature control may be independently performed only on a particular region where the thermoelectric module is actually in contact with the user's body in accordance with a usage environment (e.g., the user's body type and posture), thereby obtaining an advantageous effect of improving temperature control efficiency and energy efficiency of the thermoelectric module.

In particular, the second substrate comprises an elastic material which is elastically deformable when the pressing force is applied.

Since the second substrate comprises an elastically deformable material as described above, a part of the second substrate is locally and elastically deformed when the pressing force is applied to the second substrate due to the contact with the user's body. As a result, only some of the multiple second electrodes, which correspond to different unit thermoelectric materials, may be electrically connected to the second ends of some of the N-type thermoelectric materials and the second ends of some of the P-type thermoelectric materials (e.g., the N-type thermoelectric materials and the P-type thermoelectric materials disposed below the region where the pressing force is applied).

In addition, elastic support parts are arranged between the first substrate and the second substrate.

The elastic support parts are arranged between the first substrate and the second substrate as described above, and as a result, when the pressing force applied to the second substrate is released, the second substrate returns to the initial position by the elastic force of the elastic support part, such that the gap between the second electrode and the unit thermoelectric material may be maintained.

As an example, the elastic support part includes a first side elastic member disposed on an outer surface of the N-type thermoelectric material, and a second side elastic member disposed on an outer surface of the P-type thermoelectric material.

As another example, the elastic support part includes a center elastic member disposed between the N-type thermoelectric material and the P-type thermoelectric material.

As still another example, the elastic support part includes a rigid member disposed between the first substrate and the second substrate, and an elastic member disposed on at least one of plural ends of the rigid member. Since the elastic support part is formed to have a double-layer structure including the rigid member and the elastic member as described above, it is possible to inhibit the second substrate from being excessively deformed, and it is possible to inhibit the pressing force from being excessively applied to the unit thermoelectric material when the second electrode comes into contact with the unit thermoelectric material. As a result, it is possible to obtain an advantageous effect of preventing the unit thermoelectric material from being damaged and broken due to the excessive pressing force applied to the unit thermoelectric material.

In particular, the elastic support part comprises a nonconductive material. As such, an advantageous effect of preventing a leakage current caused by the contact between the elastic support parts and the respective electrodes (the first electrodes and the second electrodes) can be obtained.

In addition, the multiple unit thermoelectric materials, which constitute the thermoelectric module, are connected to the power supply unit in parallel.

According to another exemplary embodiment, the multiple unit thermoelectric materials, which constitute the thermoelectric module, are connected to the power supply unit in series. Since the multiple unit thermoelectric materials, which constitute the thermoelectric module, are connected to the power supply unit in series as described above, the thermoelectric module may ensure sufficient resistance, thereby obtaining an advantageous effect of inhibiting an overcurrent from being applied to the thermoelectric module.

The thermoelectric module includes a resistance measuring unit configured to measure total resistance made by the multiple unit thermoelectric materials; and a control unit configured to control a voltage to be applied to the first electrodes based on the resistance measured by the resistance measuring unit. This configuration is based on the fact that the total resistance of the thermoelectric module varies depending on the area where the pressing force is applied (depending on the portions where the unit thermoelectric materials and the second electrodes are connected). The total resistance of the thermoelectric module is detected in real time by the resistance measuring unit, and the voltage proportional to the detected total resistance is controlled and applied, thereby obtaining an advantageous effect of continuously applying the constant current to the unit thermoelectric materials.

According to the present disclosure described above, it is possible to obtain an advantageous effect of improving temperature control efficiency and energy efficiency of the thermoelectric module.

In particular, according to various aspects of the present disclosure, the temperature control is not performed on the entire region of the thermoelectric module in a lump, but the temperature control may be independently performed only on a particular region where the thermoelectric module is actually in contact with the user's body in accordance with a usage environment (e.g., the user's body type and posture). As a result, it is possible to obtain an advantageous effect of minimizing a thermal loss and significantly reducing power consumption.

DETAILED DESCRIPTION

Figure 1:
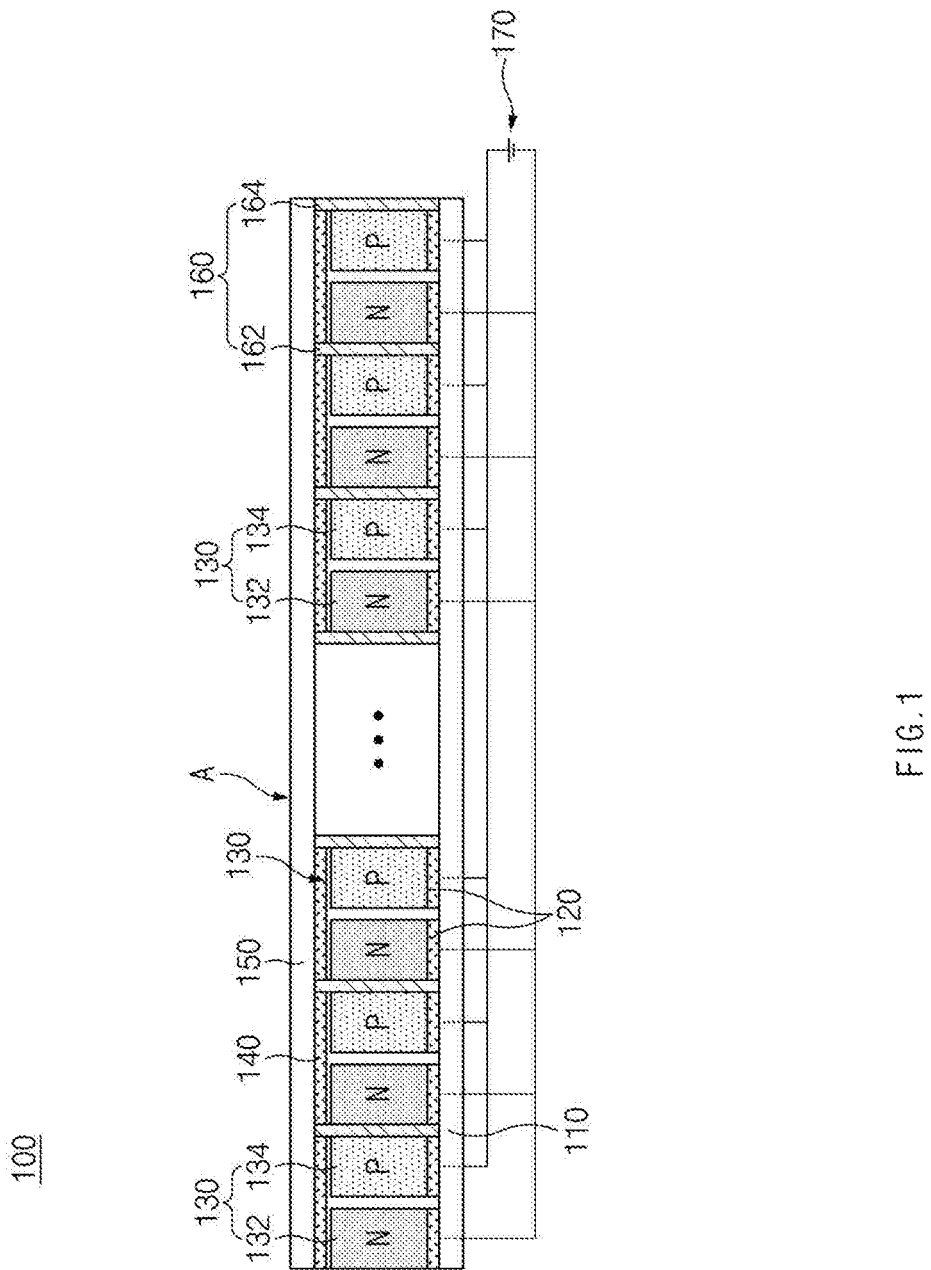
FIG. 1 is a view for explaining a thermoelectric module according to one exemplary embodiment of the present disclosure.

Hereinafter, exemplary embodiments of the present disclosure will be described in detail with reference to the accompanying drawings, but the present disclosure is not restricted or limited by the exemplary embodiments. For reference, like reference numerals denote substantially identical elements in the present description, the description may be made under this rule by incorporating the contents illustrated in other drawings, and the contents repeated or determined as being obvious to those skilled in the art may be omitted.

Figure 2:
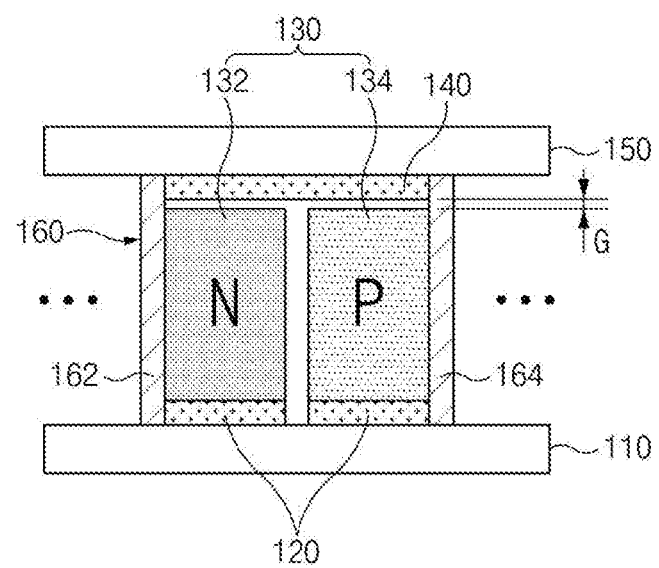
FIG. 2 is an enlarged view of part 'A' in FIG. 1.
Figure 3:
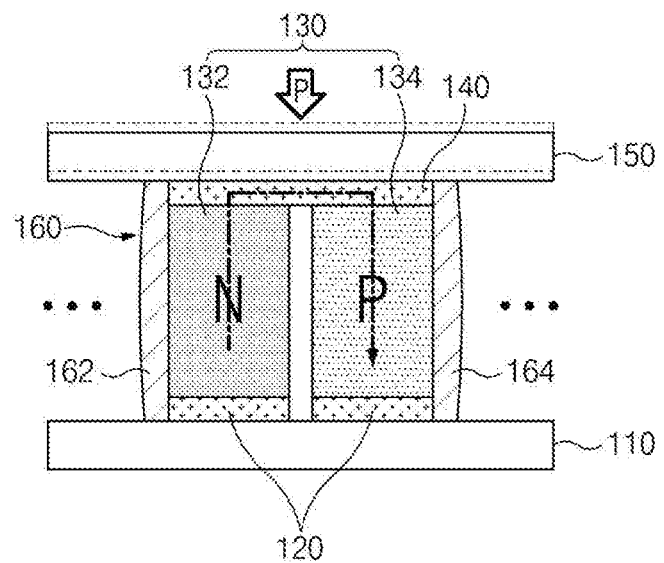
FIG. 3 is a view for explaining a state in which an N-type thermoelectric material and a P-type thermoelectric material form a closed circuit when a pressing force is applied in the thermoelectric module according to one exemplary embodiment of the present disclosure.
Figure 4:
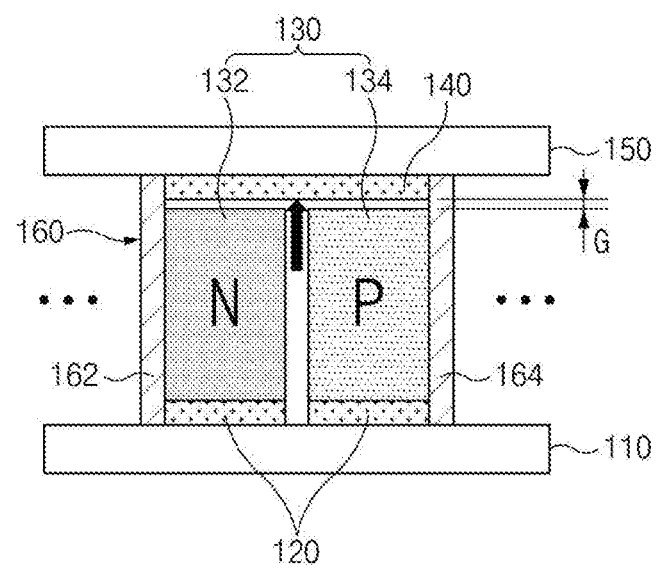
FIG. 4 is a view for explaining a state in which the N-type thermoelectric material and the P-type thermoelectric material form an open circuit when the pressing force is released in the thermoelectric module according to one exemplary embodiment of the present disclosure.
Figure 5:
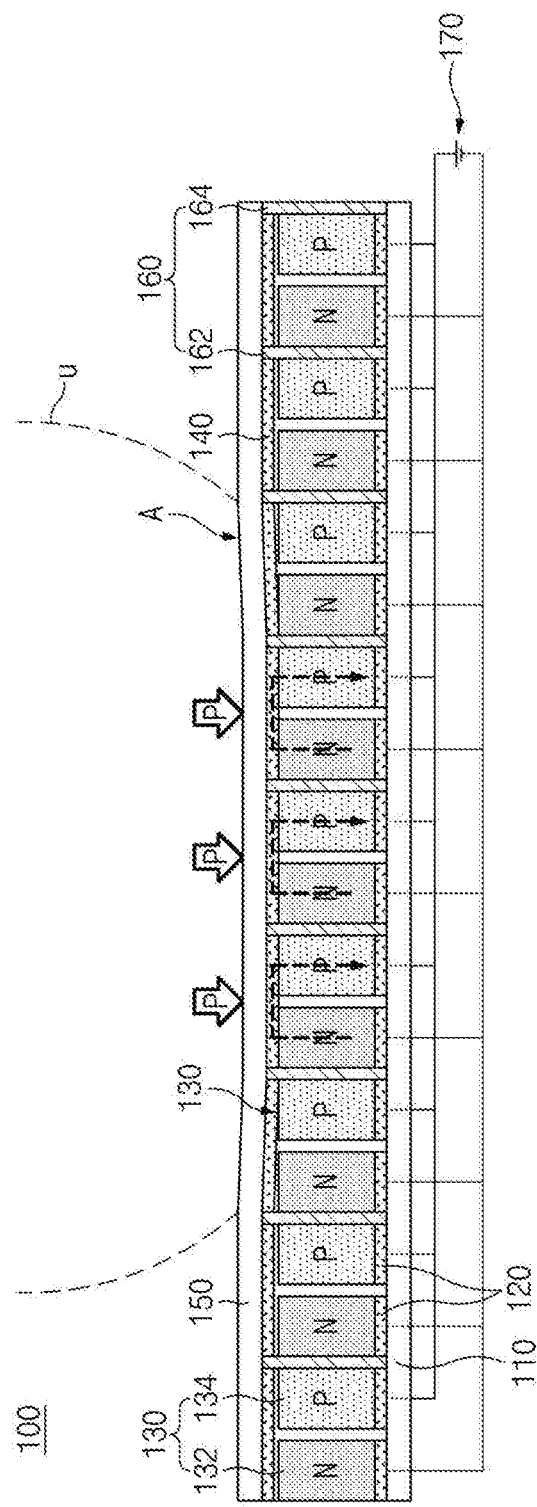
FIG. 5 is a view for explaining operating states of unit thermoelectric materials when the pressing force is locally applied in the thermoelectric module according to one exemplary embodiment of the present disclosure.
Figure 6:
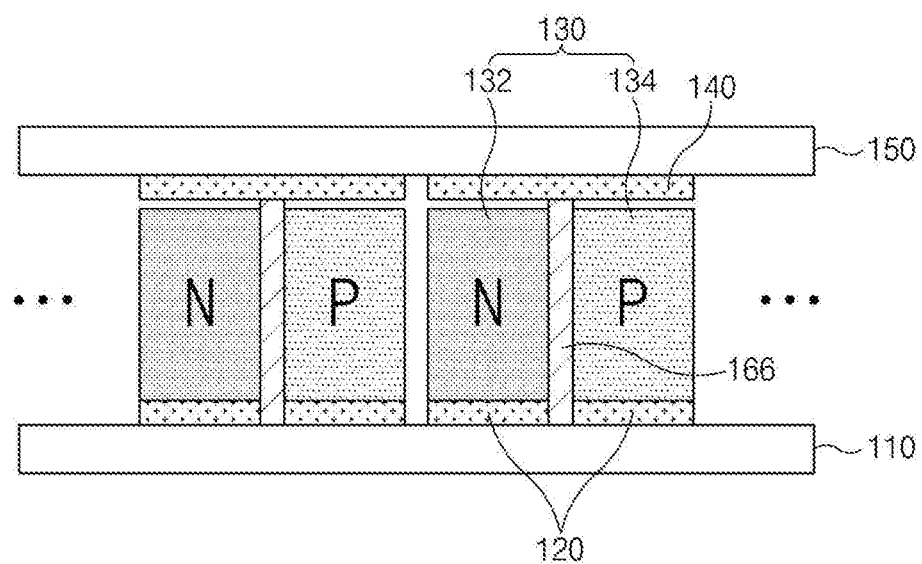
FIG. 6 is a view for explaining another exemplary embodiment of an elastic support part in the thermoelectric module according to one exemplary embodiment of the present disclosure.
Figure 7:
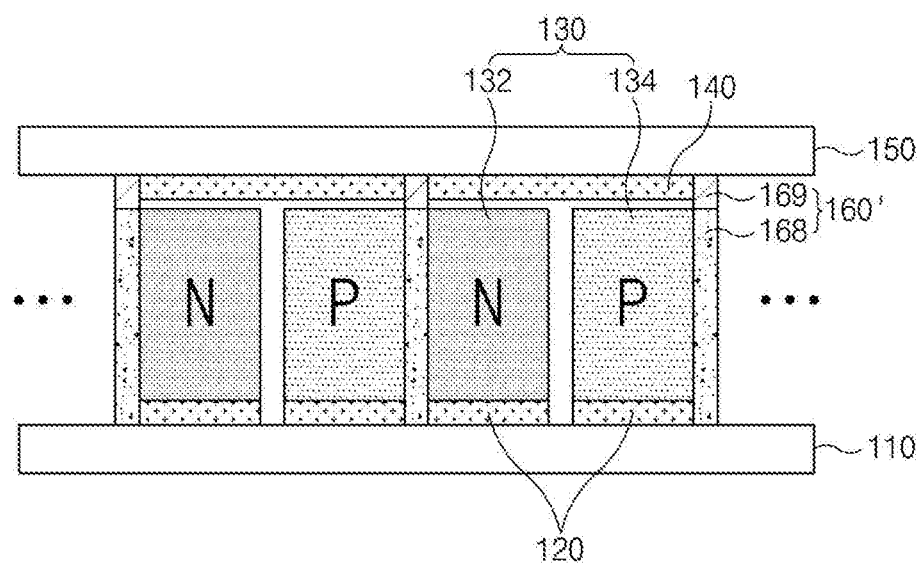
FIG. 7 is a view for explaining still another exemplary embodiment of the elastic support part in the thermoelectric module according to one exemplary embodiment of the present disclosure.
Figure 8:
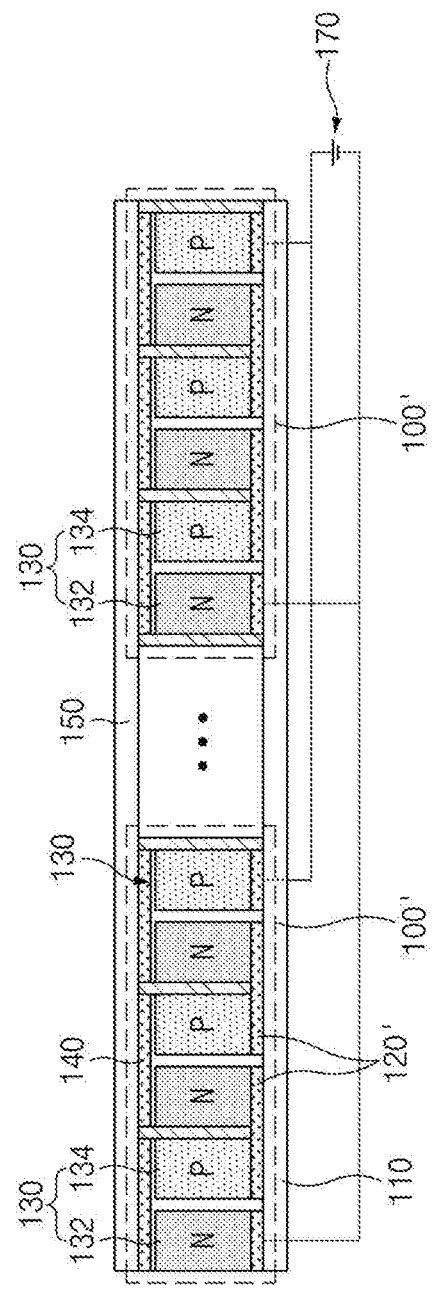
FIG. 8 is a view for explaining a series structure of the unit thermoelectric materials in the thermoelectric module according to one exemplary embodiment of the present disclosure.
Figure 9:
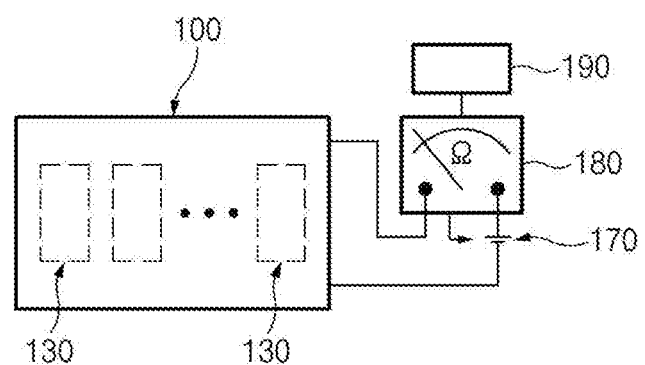
FIG. 9 is a view for explaining a resistance measuring unit and a control unit in the thermoelectric module according to one exemplary embodiment of the present disclosure.

FIG. 1 is a view for explaining a thermoelectric module according to one exemplary embodiment of the present disclosure, and FIG. 2 is an enlarged view of part 'A' in FIG. 1. In addition, FIG. 3 is a view for explaining a state in which an N-type thermoelectric material and a P-type thermoelectric material form a closed circuit when a pressing force is applied in the thermoelectric module according to one exemplary embodiment of the present disclosure, FIG. 4 is a view for explaining a state in which the N-type thermoelectric material and the P-type thermoelectric material form an open circuit when the pressing force is released in the thermoelectric module according to one exemplary embodiment of the present disclosure, and FIG. 5 is a view for explaining operating states of unit thermoelectric materials when the pressing force is locally applied in the thermoelectric module according to one exemplary embodiment of the present disclosure. Further, FIG. 6 is a view for explaining another exemplary embodiment of an elastic support part in the thermoelectric module according to one exemplary embodiment of the present disclosure, and FIG. 7 is a view for explaining still another exemplary embodiment of the elastic support part in the thermoelectric module according to one exemplary embodiment of the present disclosure. Meanwhile, FIG. 8 is a view for explaining a series structure of the unit thermoelectric materials in the thermoelectric module according to one exemplary embodiment of the present disclosure, and FIG. 9 is a view for explaining a resistance measuring unit and a control unit in the thermoelectric module according to one exemplary embodiment of the present disclosure.

Referring to FIGS. 1 to 9, a thermoelectric module 100 according to one exemplary embodiment of the present disclosure includes a first substrate 110, multiple unit thermoelectric materials 130 including N-type thermoelectric materials 132 and P-type thermoelectric materials 134 and arranged on one surface of the first substrate 110, multiple first electrodes 120 each electrically connected to a first end of a respective one of the N-type thermoelectric materials 132 or to a first end of each of the P-type thermoelectric materials 134 and configured to be supplied with power from a power supply unit 170 multiple second electrodes 140 each disposed to be spaced apart from a second end of the respective one of the N-type thermoelectric materials 132 and a second end of the respective one of the P-type thermoelectric materials 134 by a predetermined gap (G in FIG. 2), and a second substrate 150 configured to support the second electrodes 140. Each of the second electrodes 140 is electrically connected to the second end of the respective one of the N-type thermoelectric materials 132 and the second end of the respective one of the P-type thermoelectric materials 134 when a pressing force P is applied to the second substrate 150 from outside.

The first substrate 110 is provided to maintain an appearance of the thermoelectric module 100 and to protect the unit thermoelectric materials 130 from an external environment.

The first substrate 110 may be variously changed in shape, material, and structure depending on required conditions and usage environments, but the present disclosure is not restricted or limited by the shape, the material, and the structure of the first substrate 110. As an example, the first substrate 110 may be made of a flexible material (e.g., silicone, etc.) having an electrically insulating property.

Each of the unit thermoelectric materials 130 includes one N-type thermoelectric material 132 and one P-type thermoelectric material 134 that have opposite polarities. The unit thermoelectric materials 130 are arranged on one surface (e.g., an upper surface) of the first substrate 110 in a predetermined pattern.

As an example, the unit thermoelectric materials 130 may be arranged in a zigzag pattern. According to another exemplary embodiment of the present disclosure, the unit thermoelectric materials 130 may be arranged in a straight pattern or in other patterns, but the present disclosure is not restricted or limited by the arrangement pattern of the unit thermoelectric materials 130.

Each of the first electrodes 120 is electrically connected to the first end of the respective one of the N-type thermoelectric materials 132 or to the first end of the respective one of the P-type thermoelectric materials 134, and power is applied to the first electrodes 120 from the power supply unit 170.

Here, applying power to the first electrodes 120 includes applying a forward current or a reverse current to the first electrodes 120. For example, the unit thermoelectric materials 130 may be heated when the forward current is applied to the first electrodes 120, and on the contrary, the unit thermoelectric materials 130 may be cooled when the reverse current is applied to the first electrodes 120.

More specifically, the first electrodes 120 are disposed at a lower end of the unit thermoelectric material 130 and arranged between the unit thermoelectric material 130 and the first substrate 110. In some instances, other layers such as a joining layer may be arranged between the unit thermoelectric material 130 and the first electrodes 120.

The first electrode 120 may be made of a typical metal material (e.g., copper) capable of being electrically connected to the unit thermoelectric material 130, but the present disclosure is not restricted or limited by the material of the first electrode 120.

According to one aspect of the present disclosure, the multiple unit thermoelectric materials 130, which constitute the thermoelectric module 100, may be connected, in parallel or in series, to the power supply unit 170.

As an example, FIG. 1 shows a structure of a thermoelectric module 100 which comprises multiple unit thermoelectric materials 130 connected to the power supply unit 170 in parallel. Referring to FIG. 1, the first electrodes 120 are individually connected to the lower end of each of the N-type thermoelectric materials 132 and the lower end of each of the P-type thermoelectric materials 134 of the unit thermoelectric materials 130, and the multiple first electrodes 120 are connected to the power supply unit 170 in parallel.

As another example, FIG. 8 shows a structure of a thermoelectric module 100' which comprises multiple unit thermoelectric materials 130 connected to the power supply unit 170 in series. Referring to FIG. 8, the first electrodes 120 are integrally connected to the lower ends of the thermoelectric materials (the N-type thermoelectric materials and the P-type thermoelectric materials), which have opposite polarities, of the unit thermoelectric materials 130 adjacent to each other, and the multiple first electrodes 120 are connected to the power supply unit 170 in series. For example, when a first unit thermoelectric material 130 and a second unit thermoelectric material 130, each having one N-type thermoelectric material 132 and one P-type thermoelectric material 134, are disposed to be adjacent to each other, the first electrode 120 is structured to be connected to both of the N-type thermoelectric material 132 of the first unit thermoelectric material 130 and the P-type thermoelectric material 134 of the second unit thermoelectric material 130.

The second electrodes 140 are disposed to be spaced apart from the second end of the respective one of the N-type thermoelectric materials 132 and the second end of the respective one of the P-type thermoelectric materials 134 by the predetermined gap G, and the second substrate 150 is provided to support the second electrodes 140.

More specifically, the second electrode 140 is structured to be connected to both of the N-type thermoelectric material 132 and the P-type thermoelectric material 134 that constitute the unit thermoelectric material 130, and the second electrode 140 is disposed to be spaced apart from an upper end of the unit thermoelectric material 130 by the gap G.

The second electrode 140 may be made of a typical metal material (e.g., copper) capable of being electrically connected to the unit thermoelectric material 130, but the present disclosure is not restricted or limited by the material of the second electrode 140.

In this case, the gap G between the second electrode 140 and the unit thermoelectric material 130 may be varied depending on the material of the second substrate 150 or usage environments.

That is, in a case in which the gap G is equal to or larger than a predetermined magnitude, the second electrode 140 is hardly connected to the unit thermoelectric material 130 even though the second substrate 150 is pressed. On the contrary, in a case in which the gap G is equal to or smaller than a predetermined magnitude, the unit thermoelectric material 130 may be broken or damaged by a pressing force P with which the second electrode 140 pressed by the second substrate 150 presses the unit thermoelectric material 130. Therefore, the magnitude of the gap G needs to be adjustable in accordance with the material of the second substrate 150 or usage environments.

As an example, the magnitude of the gap G between the second electrode 140 and the unit thermoelectric material 130 may correspond to a bending deformation height of the second substrate 150 when a user's body comes into contact with the second substrate 150 and the second substrate 150 is pressed.

The second substrate 150 and the first substrate 110 are provided to maintain the appearance of the thermoelectric module 100 and to protect the unit thermoelectric materials 130 from an external environment.

The second substrate 150 may have different shapes, materials, and structures depending on required conditions and usage environments, but the present disclosure is not restricted or limited by the shape, the material, and the structure of the second substrate 150.

In particular, the second substrate 150 is made of a material (e.g., silicone) capable of being elastically bent when the user's body comes into contact with the second substrate 150. More particularly, the second substrate 150 has an electrically insulating property.

Since the second substrate 150 is made of an elastically deformable material as described above, a part of the second substrate 150 is locally and elastically deformed when the pressing force P is applied to the second substrate 150 due to the contact with the user's body U, as illustrated in FIG. 5. As a result, only some of the multiple second electrodes 140, which correspond to different unit thermoelectric materials 130, may be electrically connected to the second ends of some of the N-type thermoelectric materials 132 and the second ends of some of the P-type thermoelectric materials 134 (e.g., the N-type thermoelectric materials and the P-type thermoelectric materials disposed below the region where the pressing force is applied).

In particular, elastic support parts 160 are arranged between the first substrate 110 and the second substrate 150.

The elastic support part 160 is provided between the first substrate 110 and the second substrate 150. When the pressing force P applied to the second substrate 150 is released, the second substrate 150 returns to the initial position by the elastic force of the elastic support part 160, such that the gap G between the second electrode 140 and the unit thermoelectric material 130 may be maintained.

Here, the configuration of the gap G between the second electrode 140 and the unit thermoelectric material 130 being maintained means that the state in which the second electrode 140 is spaced apart from the unit thermoelectric material 130 by the predetermined gap G is maintained.

In order to maintain the gap G, the elastic support part 160 may have various structures capable of elastically supporting the second electrodes 140 attached to the second substrate 150.

As an example, referring to FIGS. 2 to 4, the elastic support part 160 includes a first side elastic member 162 disposed on an outer surface of the N-type thermoelectric material 132, and a second side elastic member 164 disposed on an outer surface of the P-type thermoelectric material 134.

Each of the first side elastic member 162 and the second side elastic member 164 is formed to have a length corresponding to an interval between the first substrate 110 and the second substrate 150.

Referring to FIG. 2, when no compressive force (pressing force applied to the second substrate) is applied to the first side elastic member 162 and the second side elastic member 164, the second electrodes 140 are supported in the state in which the second electrodes 140 are spaced apart from the unit thermoelectric materials 130 by the predetermined gap G. When the gap G is present between the second electrode 140 and the unit thermoelectric material 130, the unit thermoelectric material 130 is not heated or cooled even though power is applied to the unit thermoelectric material 130.

Referring to FIG. 3 when the pressing force P is applied to the second substrate 150 and the second substrate 150 is deformed, the first side elastic member 162 and the second side elastic member 164 are compressed, such that the second electrode 140 is connected to the unit thermoelectric material 130. When the second electrode 140 is connected to the unit thermoelectric material 130, the N-type thermoelectric material 132 and the P-type thermoelectric material 134 form a closed circuit, such that the unit thermoelectric material 130 is heated or cooled.

As illustrated in FIG. 4, when the pressing force P applied to the second substrate 150 is released, the second substrate 150 returns to the initial position (e.g., the position before the second substrate 150 is deformed) by an elastic restoring force of the first side elastic member 162 and the second side elastic member 164, such that the second electrode 140 returns to be spaced apart from the unit thermoelectric material 130 by the predetermined gap G.

According to one exemplary embodiment of the present disclosure, the first side elastic member 162 is disposed on the outer surface of the N-type thermoelectric material 132 and the second side elastic member 164 is disposed on the outer surface of the P-type thermoelectric material 134. On the other hand, according to another exemplary embodiment of the present disclosure, only one of the first side elastic member 162 and the second side elastic member 164 may be used.

According to still another exemplary embodiment of the present disclosure, the elastic support part 160 includes a center elastic member 166 disposed between the N-type thermoelectric material 132 and the P-type thermoelectric material 134.

Referring to FIG. 6, the center elastic member 166 is disposed between the N-type thermoelectric material 132 and the P-type thermoelectric material 134, constituting a unit thermoelectric material 130, and the center elastic member 166 elastically supports the second electrode 140.

With the above-mentioned structure, when the pressing force P is applied to the second substrate 150, the center elastic member 166 is compressed, such that the second electrode 140 is connected to both of the N-type thermoelectric material 132 and the P-type thermoelectric material 134.

According to still another exemplary embodiment of the present disclosure, an elastic support part 160' includes a rigid member 168 disposed between the first substrate 110 and the second substrate 150, and an elastic member 169 disposed on at least one of plural ends of the rigid member 168.

As an example, referring to FIG. 7, the elastic member 169 may be disposed at an upper end (based on FIG. 7) of the rigid member 168. In some instances, the elastic member 169 may be disposed at a lower end of the rigid member 168, or disposed at both of the upper and lower ends of the rigid member 168.

Here, the rigid member 168 refers to a member made of an incompressible material that is not compressed when the pressing force P is applied, but the present disclosure is not restricted or limited by the material of the rigid member 168.

Since the elastic support part 160' has a double-layer structure including the rigid member 168 and the elastic member 169 as described above, it is possible to inhibit the second substrate 150 from being excessively deformed, and it is possible to inhibit the pressing force P from being excessively applied to the unit thermoelectric material 130 when the second electrode 140 comes into contact with the unit thermoelectric material 130. As a result, it is possible to obtain an advantageous effect of preventing the unit thermoelectric material 130 from being damaged and broken due to the excessive pressing force P applied to the unit thermoelectric material 130.

According to an exemplary embodiment of the present disclosure, the elastic member 169 may be disposed at an end of the rigid member 168. However, according to another exemplary embodiment of the present disclosure, the elastic member 169 may be disposed at a portion (e.g., a central portion) spaced apart from the end of the rigid member 168.

In addition, the elastic support parts 160' each including the rigid member 168 and the elastic members 169 may be disposed on the outer surface of the N-type thermoelectric material 132 and the outer surface of the P-type thermoelectric material 134, or the elastic support part 160' may be disposed between the N-type thermoelectric material 132 and the P-type thermoelectric material 134. The arrangement position of the elastic support part 160' may be variously changed depending on required conditions and design specifications.

In particular, each of the elastic support parts 160 and 160' is made of a non-conductive material.

For reference, in the present disclosure, the case in which each of the elastic support parts 160 and 160' is made of a non-conductive material may include both cases in which the elastic support parts 160 and 160' have no electrical conductivity or have very low electrical conductivity so that there is no leakage current.

Each of the elastic support parts 160 and 160' is made of a non-conductive material as described above, thereby obtaining an advantageous effect of preventing a leakage current caused by the contact between the elastic support parts 160 and 160' and the respective electrodes (the first electrodes and the second electrodes).

Meanwhile, as described above, referring to FIG. 8, the multiple unit thermoelectric materials 130, which constitute the thermoelectric module 100', may be connected to the power supply unit 170 in series.

Since the multiple unit thermoelectric materials 130 are connected to the power supply unit 170 in series as described above, the thermoelectric module 100' may ensure sufficient resistance, thereby obtaining an, advantageous effect of inhibiting an overcurrent from being applied to the thermoelectric module 100'.

That is, because each of the unit thermoelectric materials 130 has low resistance in the structure (see, e.g., FIG. 1) in which the multiple unit thermoelectric materials 130 are connected to the power supply unit 170 in parallel, a relatively high current flows through the unit thermoelectric material 130 even though the same external voltage is applied. In contrast, in the case in which the multiple unit thermoelectric materials 130 are connected in series and configured as a single module, it is possible to ensure resistance enough to inhibit the overcurrent, thereby obtaining an advantageous effect of maintaining a current value at an appropriate level against the external voltage.

In addition, referring to FIG. 9, a thermoelectric module 100 according to one aspect of the present disclosure may include a resistance measuring unit 180 (e.g., an ohmmeter) configured to measure total resistance made by the multiple unit thermoelectric materials 130, and a control unit 190 configured to control the voltage to be applied to the first electrodes 120 based on the resistance measured by the resistance measuring unit 180. The control unit 190 of the apparatus according to an exemplary embodiment of the present disclosure may be a processor (e.g., computer, microprocessor, CPU, ASIC, circuitry, logic circuits, etc.).

As described above, the total resistance $\Omega$ made by the multiple unit thermoelectric materials 130 is measured, and the voltage to be applied to the first electrodes 120 is controlled based on the measurement result (total resistance), such that a constant current may be always applied to the unit thermoelectric materials 130.

This configuration is based on the fact that the total resistance of the thermoelectric module 100 varies depending on the area where the pressing force P is applied (depending on the portions where the unit thermoelectric materials and the second electrodes are connected). The total resistance of the thermoelectric module 100 is detected in real time by the resistance measuring unit, and the voltage proportional to the detected total resistance is controlled and applied, thereby obtaining an advantageous effect of always applying the constant current to the unit thermoelectric materials 130.

While the present disclosure has been described above with reference to the exemplary embodiments, it may be understood by those skilled in the art that the present disclosure may be variously modified and changed without departing from the spirit and scope of the present disclosure disclosed in the claims.

What is claimed is:
1. A thermoelectric module comprising:
a first substrate;
multiple unit thermoelectric materials comprising N-type thermoelectric materials and P-type thermoelectric materials and arranged on one surface of the first substrate;
multiple first electrodes each electrically connected to a first end of a respective one of the N-type thermoelectric materials or to a first end of a respective one of the P-type thermoelectric materials, the multiple first electrodes being configured to be supplied with electric power from a power supply unit;

multiple second electrodes each disposed to be spaced apart from a second end of the respective one of the N-type thermoelectric materials and a second end of the respective one of the P-type thermoelectric materials by a predetermined gap; and a second substrate configured to support the multiple second electrodes, wherein each of the multiple second electrodes is electrically connected to the second end of the respective one of the N-type thermoelectric materials and the second end of the respective one of the P-type thermoelectric materials when a pressing force is applied to the second substrate from outside of the thermoelectric module, wherein elastic support parts are arranged between the first substrate and the second substrate so that the predetermined gap is maintained when the pressing force is released, wherein one of the elastic support parts comprises:

a rigid member extending perpendicularly to the second substrate along a vertical direction in which the pressing force is applied to the second substrate and disposed on a side surface of at least one of the N-type thermoelectric materials or P-type thermoelectric materials between the first substrate and the second substrate; and an elastic member disposed on at least one of plural ends of the rigid member, and, wherein a length of the rigid member in the vertical direction is greater than a length of the multiple unit thermoelectric materials in the vertical direction.

2. The thermoelectric module of claim 1, wherein the second substrate includes an elastic material which is elastically deformable when the pressing force is applied.

3. A thermoelectric module comprising:

a first substrate;

multiple unit thermoelectric materials comprising N-type thermoelectric materials and P-type thermoelectric materials and arranged on one surface of the first substrate;

multiple first electrodes each electrically connected to a first end of a respective one of the N-type thermoelectric materials or to a first end of a respective one of the P-type thermoelectric materials, the multiple first electrodes being configured to be supplied with electric power from a power supply unit;

multiple second electrodes each disposed to be spaced apart from a second end of the respective one of the N-type thermoelectric materials and a second end of the respective one of the P-type thermoelectric materials by a predetermined gap; and a second substrate configured to support the multiple second electrodes, wherein the second substrate is locally and elastically deformed when a pressing force is applied to the second substrate from outside of the thermoelectric module, such that some of the multiple second electrodes are electrically connected to the second ends of some of the N-type thermoelectric materials and the second ends of some of the P-type thermoelectric materials, wherein elastic support parts are arranged between the first substrate and the second substrate so that the predetermined gap is maintained when the pressing force is released, wherein one of the elastic support parts comprises:

a rigid member extending perpendicularly to the second substrate along a vertical direction in which the pressing force is applied to the second substrate and disposed on a side surface of at least one of the N-type thermoelectric materials or P-type thermoelectric materials between the first substrate and the second substrate; and an elastic member disposed on at least one of plural ends of the rigid member, and, wherein a length of the rigid member in the vertical direction is greater than a length of the multiple unit thermoelectric materials in the vertical direction.

4. The thermoelectric module of claim 1, wherein another one of the elastic support parts comprises any one, or both, of a first side elastic member disposed on an outer surface of one of the N-type thermoelectric materials and a second side elastic member disposed on an outer surface of one of the P-type thermoelectric materials.

5. The thermoelectric module of claim 1, wherein another one of the elastic support parts comprises a center elastic member disposed between one of the N-type thermoelectric materials and one of the P-type thermoelectric materials.

6. The thermoelectric module of claim 1, wherein the one of the elastic support parts comprises a non-conductive material.

7. The thermoelectric module of claim 1, wherein the multiple unit thermoelectric materials are connected, in parallel, to the power supply unit.

8. The thermoelectric module of claim 1, wherein the multiple unit thermoelectric materials are connected, in series, to the power supply unit.

9. The thermoelectric module of claim 1, comprising:

a resistance measuring unit configured to measure a total resistance of the multiple unit thermoelectric materials; and a control unit configured to control a voltage to be applied to the multiple first electrodes based on the total resistance measured by the resistance measuring unit.

10. The thermoelectric module of claim 1, wherein the power supply unit selectively applies a forward current or a reverse current to each of the multiple unit thermoelectric materials.

\* \* \* \* \*